United States Patent [19]

Cline et al.

[11] Patent Number: 4,597,061

[45] Date of Patent: Jun. 24, 1986

[54] MEMORY SYSTEM USING PIPELINE CIRCUITRY FOR IMPROVED SPEED

[75] Inventors: James H. Cline, Allen; David M. Chastain, Plano, both of Tex.

[73] Assignee: Texas Instruments Incorporated, Dallas, Tex.

[21] Appl. No.: 454,938

[22] Filed: Jan. 3, 1983

[51] Int. Cl.⁴ ...................... G11C 11/40; G11C 13/00
[52] U.S. Cl. ................................... 365/189; 365/220
[58] Field of Search ................ 365/189, 230, 221, 238

[56] References Cited

U.S. PATENT DOCUMENTS 4,330,852  5/1982  Redwine et al. .................... 365/221

*Primary Examiner*—Terrell W. Fears
*Attorney, Agent, or Firm*—Kenneth C. Hill; Robert O. Groover; James T. Comfort

[57] ABSTRACT

A memory apparatus including an array of storage elements connected to a plurality of addressing lines for selectively connecting a group of storage elements to a plurality of data lines. Control circuitry is also provided that is connected to the array for regulating the reading and writing of data to and from the data lines to the storage elements addressed by the address lines. A pipeline circuit is also provided that is connected to the address lines and to array of storage elements to store in response to the control circuit an address contained on the address lines. This memory system architecture allows for the address to be stored to allow the second address to be placed on the address lines while the first addressed data is being accessed from the memory array. This memory system also provides for the parity to be generated for the data in the array during the access of the data for the first address or after the pipeline circuit has been loaded with the second address.

5 Claims, 9 Drawing Figures

INPUT

| | | | | | | | | | | | | | | | |
|---|---|---|---|---|---|---|---|---|---|---|---|---|---|---|---|
| IRST | 0 | 1 | 1 | 1 | 1 | 1 | 1 | 1 | 1 | 1 | 1 | 1 | 1 | 1 | 1 |
| CS | X | X | 0 | 0 | 0 | 0 | 0 | 0 | 1 | 1 | 1 | 0 | 0 | 0 | 0 |
| CT0 | X | 0 | 0 | 0 | 0 | 0 | 1 | X | 1 | X | X | 1 | 1 | 1 | 1 |
| CT1 | X | 0 | 0 | 0 | 1 | 1 | 1 | 1 | X | 1 | X | 0 | 0 | 0 | 0 |
| CS2 | X | 0 | 1 | 1 | 1 | 1 | 1 | 0 | X | X | 1 | 0 | 1 | 1 | 1 |
| CPUPROT | X | X | X | X | 0 | 1 | X | X | X | X | X | X | X | X | X |
| DMAPROT | X | X | 0 | 1 | X | X | X | X | X | X | X | X | X | X | X |
| BA3 | X | X | X | X | X | X | X | X | X | X | X | 0 | 0 | 0 | 1 |
| BA4 | X | X | X | X | X | X | X | X | X | X | X | 0 | 1 | 0 |  |

OUTPUT

| | | | | | | | | | | | | | | | |
|---|---|---|---|---|---|---|---|---|---|---|---|---|---|---|---|
| MEMEN | 0 | 0 | 1 | 0 | 1 | 0 | 1 | 1 | 0 | 0 | 0 | 0 | 0 | 0 | 0 |
| WRITEN | 0 | 0 | 1 | 0 | 1 | 0 | 1 | 0 | 0 | 0 | 0 | 0 | 0 | 0 | 0 |
| PVEN | 0 | 0 | 1 | 1 | 1 | 1 | 1 | 1 | 1 | 1 | 1 | 1 | 1 | 1 | 1 |
| PV | X | X | 1 | 0 | 1 | 0 | 1 | 1 | 1 | 1 | 1 | 0 | 0 | 0 | 0 |
| DOUT | 1 | 1 | 1 | 1 | 1 | 1 | 1 | 0 | 0 | 0 | 0 | 1 | 1 | 1 | 1 |
| DMAW | 0 | 0 | 0 | 0 | 0 | 0 | 0 | 0 | 0 | 0 | 0 | 0 | 0 | 1 | 0 |
| CPUW | 0 | 0 | 0 | 0 | 0 | 0 | 0 | 0 | 0 | 0 | 0 | 0 | 1 | 0 | 0 |
| CFW | 0 | 0 | 0 | 0 | 0 | 0 | 0 | 0 | 0 | 0 | 0 | 0 | 0 | 0 | 1 |

- I.O WRITE CONFIGURATION
- I.O WRITE DMA FILE
- I.O WRITE CPU FILE
- I.O READ
- DESELECT
- DESELECT
- DESELECT
- MEMORY READ
- WRITE OVERRIDE
- CPU WRITE FAILURE
- CPU WRITE
- DMA WRITE FAILURE
- DMA WRITE
- HALT
- RESET

MEMORY SYSTEM USING PIPELINE CIRCUITRY FOR IMPROVED SPEED

BACKGROUND

1. Field of the Invention

This invention relates to static RAMs and more specifically to static RAMs including peripheral circuitry.

2. Description of the Prior Art

There are two basic types of semiconductor memory. The first type is dynamic random access memory or dynamic RAM and stores data in cells for short periods of time. Since the storage of data in these dynamic RAM cells is short, they require refreshing. The second type of semiconductor memory is static RAM which does not require refreshing. The disadvantage of static RAM over dynamic RAM is that static RAM occupies a larger semiconductor surface area than dynamic RAM.

The prior static RAM devices that exist perform the simple task of storing data in memory. If the memory is to be used in systems that require pipelining or parity, additional circuits must be added to perform these additional functions. An example of the existing state of the art static RAM is the Intel 2147H described in the Intel Component Data Catalog, 1982 on pp 1-44 through 1-47.

The object of the present invention is to provide a static RAM system that includes peripheral functions such as pipeline, parity and write protect capabilities.

SUMMARY OF THE INVENTION

In accordance with the present invention, a memory system is provided that includes an array of storage elements connected to a plurality of addressing lines for selectively connecting a group of the storage elements to a plurality of data lines. Control circuitry is also provided that is connected to the array for regulating the reading and writing of data via the data lines to the storage elements addressed by the address lines. A pipeline circuit is also provided that is connected to the address lines and to the array of storage elements to store in response to the control circuits, an address contained on the address lines.

In a preferred embodiment, an array of storage elements is provided that is connected to a plurality of addressing lines for selectively connecting a group of storage elements to a plurality of data lines. The control circuitry connected to the array is for regulating the reading and writing of the elements in the array via the data lines. The pipeline circuitry provided that is connected to the address lines and to the array storage elements are areas for storing in response to the control circuit an address contained on the address lines. The storage of this address makes possible the loading of the next address on the address lines while the data from the first address in memory is being accessed by the memory. This results in an improved speed of the memory access since the second address can be loaded while the data from the first address is being placed on the data line.

In a further embodiment, the control circuit includes a set of control lines that provide the programability of the pipeline circuit. The pipeline circuit then can be programmed to either store the address on the address lines or not to store the address on the address lines. In addition to the pipeline circuit storage of the address, the control circuit may also selectively control the generation of parity in such a manner to provide the parity of data during the time that the data is first accessed or to provide the parity of the data after the second address has been input to the pipeline circuit.

DESCRIPTION OF THE DRAWINGS

The novel features believed characteristic of this invention are set forth in the appended claims. The invention itself, however, as well as other features and advantages thereof will be best understood by reference to the detailed description, read in conjunction with the accompanying drawings, wherein:

DESCRIPTION OF THE PREFERRED EMBODIMENT

Figure 1:
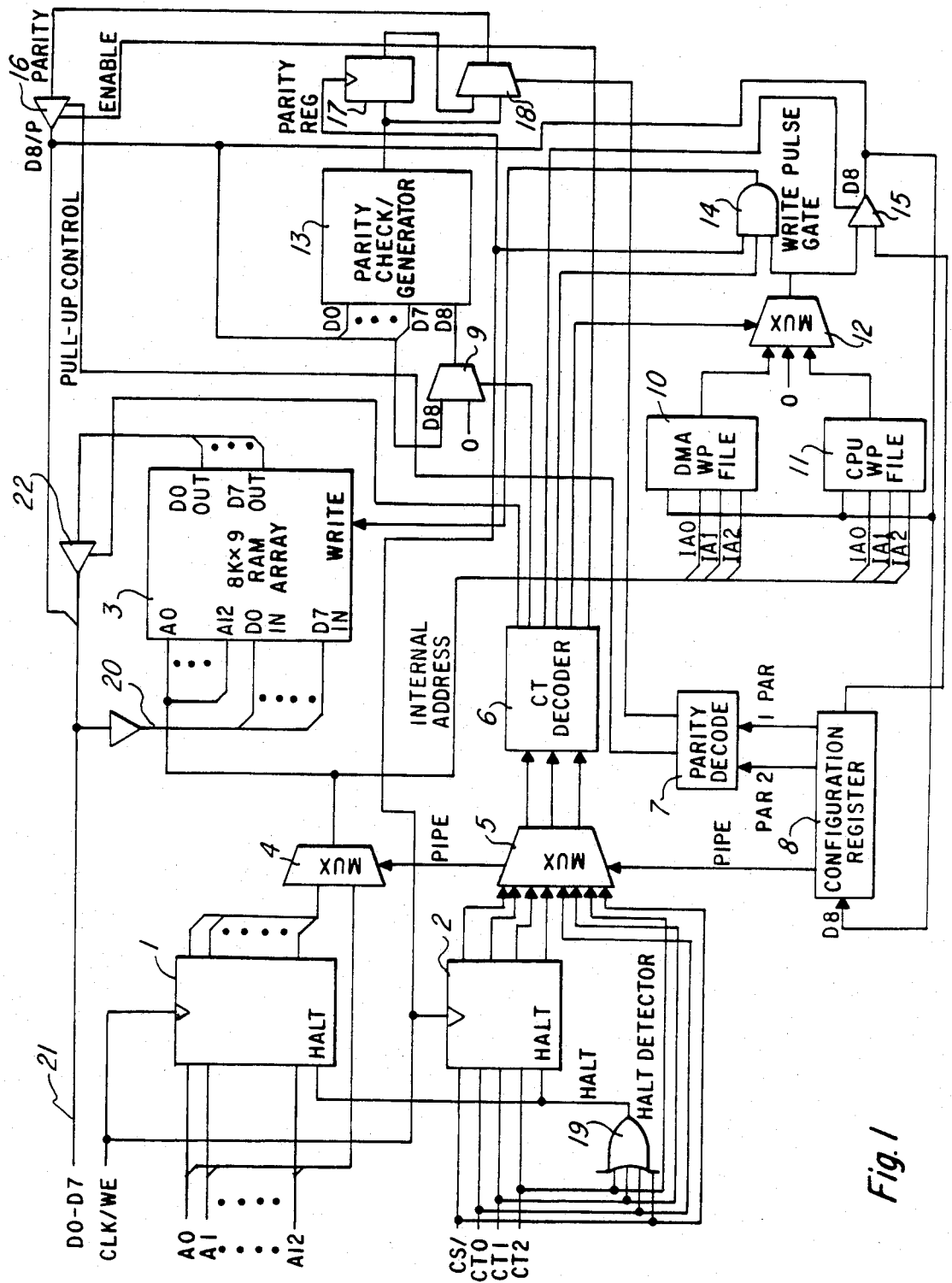
FIG. 1 is a block diagram of the memory system.

The present invention is a memory system on a single semiconductor chip rather than just a simple memory. Special features have been added in order to improve performance in order that this memory system may be used in high-speed and high-performance systems. It is felt that the integration of memory system functions onto this single chip will result in a reduction of package counts when used in computer systems. Static design is used throughout; thus eliminating the need for refresh cycles and allowing greater flexibility in system timing, as well as improved reliability.

The invention is a departure from traditional memory chips in that it has complex support functions built in. This approach was felt necessary in order to meet the increased throughput requirements of modern, complex systems and further to distribute the burden of memory support throughout the system. The preferred embodiment of this invention is a static memory device organized into 8,192 (8K) words of 9 bits each. The ninth bit allows the use of parity without extra memory chips to store the parity bit. It may also be used as a ninth data bit if desired. This invention has an on-chip parity checker/generator. This allows parity to be implemented without external logic and extra chips in the system. Parity in this invention is a programmable feature; that is, it can be turned off so that the full nine bits of memory can be directly accessed if necessary. Thirteen address lines are used to address the memory array.

Another special feature of this invention is a write protection circuit. This allows an area of memory to be protected from unintentional writes that would destroy data. The memory is divided into eight blocks of 1,024 (1k) words. Each block is associated with two bits in special registers called write-protect files. One bit is used to determine if its block of memory is to be protected against write cycles initiated by a processor (CPU or Central Processing Unit) device. The other bit performs the same function with cycles initiated by Direct Memory Access (DMA) devices. The use of the two separate write-protect files bits ensures compliance with the current Mil STD-1750A for military processors. However, this feature also makes the invention a more versatile device.

Write protection may be bypassed in this invention. This allows systems to use this invention that do not have the ability to control the write-protection bits. It also allows high priority tasks (such as system supervisor or operating system) to bypass or override write protection for testing or other reasons.

Another special feature of this invention is the capability to operate in a pipeline mode, where address and control setup may be overlapped with memory access and control operations. In pipelined mode, the address and control signals are sampled on the rising edge of a clock input. Although there is a slightly increased propagation delay through the address and control paths due to a pipeline register, this is outweighed by other factors. First, any delays because of address and control signals set up time are eliminated. Second, from a system viewpoint, processing of data from different memory cycles may overlap since the processor may simultaneously be reading or writing date from one memory cycle, while setting up the address and control lines for the next cycle.

Pipelining may be turned off to simplify system timing if desired. A system using the nonpipelined mode of operation cannot achieve the same throughput rates as a pipelined system, but the ability to operate in a nonpipelined mode does increase the versatility of this invention.

Pipelining, if used, is implemented through the use of a pipeline register which samples the address and control pins on every rising clock edge. Another register, the parity register, is used to implement pipelining of the parity function in some configurations.

Parity, write-protection and pipelining are all user programmable. This eliminates the need for a number of versions of this invention to be supported, or alternately more supporting hardware to be built. Feature programming is accomplished by what will be called I/O cycles (input/output) for the purposes of this description. In an I/O cycle, control registers are accessed in order to control the operation of all the special features. Control registers are accessed much the same way that the actual 8K memory is, except that the data path is only one bit wide. There are 19 one bit wide control registers in this invention, currently in use.

Three of the control registers form the configuration register. It is used to determine which special features are active. Parity, pipelined timing and write protection may be programmed by changing bits in this register. The function of the parity output buffer functions is also programmable. The other 16 control registers are write protect files which are used to protect 1K blocks of words from overwrites. Their function has already been explained. Their contents are ignored if write protection is overriden, but remain unaltered for future use. The write protect registers are used during DMA and CPU protected memory write cycles to gate the memory write pulses. In the event that a write pulse is blocked, a specific output goes low to indicate the write failure It is also possible to use this invention in a system that cannot support the I/O cycles which are necessary to control the special features. These modes of operations with partial or no cycle control are referred to as "dumb" modes. For example, after a reset, this invention can function as a simple 3k×9 in a nonpipelined mode without write protection of parity. These modes are later described in more detail.

The invention is controlled by 6 control lines. There are 3 CT (Cycle Type) lines which define what operation is to be performed, a chip select (CS/) to activate the chip, a reset (RST/) to return the invention to a known state, and the clock-write enable (CLK/WE) to synchronize the memory in the pipeline mode or to provide a write-enable phase in the non-pipelined mode. The CT lines identify I/O or memory cycles, reads or writes, and DMA or CPU controlled accesses. The function of the CT lines will be described in more detail.

A pin (RST/) on this chip is dedicated to resetting the memory system to a known state. Although the contents of the memory array are unaltered, the pipeline register is cleared, and the configuration and write protection registers are set to a known state. This is the only reliable way of bringing up and initializing the memory system from a cold start.

Detailed Description of the Memory Architecture

A detailed block diagram of the memory system is shown in FIG. 1. Architecturally, this memory system is a large memory array surrounded by support circuitry for parity, write protection and pipeline operations.

The memory array 3 stores 8,196 words of 9 bit each. As shown in FIG. 1, 13 address bit lines, IA0 through IA12 are used to address the array 3, and form the internal address bus. The memory address bus, A0 through A12, may be either fed directly (through only a buffer) to the internal address bus, or it may be sampled periodically using the pipeline register 1. The actual path depends upon the state of the pipeline control bit in the configuration register 8. If this bit is high, then the pipeline register is used. The memory array uses static storage cells and therefore does not require refreshing.

Data is transferred to and from the memory array 3 over the internal data bus 20 formed from bits ID0 to ID8. Data is transferred to and from the SRAM over lines D0 through D7 and D8/P which form the memory data bus 21. Lines D0 to D7 are connected to the memory internal data bus through buffers. Data bit D8/P is programmable, and may be used as an ordinary bit, or as a parity bit. If parity is active, D8/P is connected to the parity checker/generator 13 instead of ID8. In a memory write cycle, D0 through D7 are used to generate a parity bit which is fed to ID8. In a memory read cycle, 9 bits from ID0 through ID8 are fed to the parity checker, which generates a parity bit on D8/P.

The invention may be thought of as a memory with a semi-intelligent memory controller that is capable of executing a number of instructions. A different type of memory cycle is performed depending upon the instruction. An instruction is received on the CT (Cycle Type) lines (CS, CT0 through CT2) at the beginning of every cycle. These three lines CT0, CT19 and CT2 and with CS/ and RST/ are decoded to determine the operation to be performed. The CT decoder 2 is responsible for deriving the internal control signals from the CT lines. Table 1 shows the different types of cycles supported, and their codes. Conventional memories have all control signals in unencoded form available at their input pins. In order to retain all of the special features, and remain in a 32 contact package configuration, it is necessary to encode some of the control signals into a denser form. Since memory chips are traditionally used in relatively large numbers, it is advantageous to reduce the number of pins in the package.

TABLE 1

Control Decode

| CS/ | RST/ | CONTROL SIGNALS CT0 | CT1 | CT2 | SRAM 10 FUNCTION |
|---|---|---|---|---|---|
| — | 0 | — | — | — | RESET - ALL BUFFERS TRISTATED PARITY OFF, WRITE PROTECT BITS REQUIRES THREE RISING EDGES OF CLOCK TO TURN OFF RESET. |
| — | 1 | 0 | 0 | 0 | HALT CYCLE. PIPELINE REGISTER RECIRCULATES OR CHIP DESELECT IF NONPIPELINED. HALT AFTER RESET IS TREATED AS A DESELECT. |
| 0 | 1 | 0 | 0 | 1 | DMA MEMORY WRITE CYCLE |
| 0 | 1 | — | 1 | 0 | MEMORY READ CYCLE |
| 0 | 1 | 0 | 1 | 1 | CPU MEMORY WRITE CYCLE |
| 0 | 1 | 1 | 0 | 0 | I/O READ CYCLE |
| 0 | 1 | 1 | 0 | 1 | I/O WRITE CYCLE |
| 0 | 1 | 1 | 1 | 1 | MEMORY WRITE/ PROTECT OVERRIDE |
| 1 | 1 | — | — | — | NO NEW OPERATION ADDED TO PIPE (DESELECT) |

A pipeline register 1 may be switched into the address lines A0-A12. A second pipeline register 2 may be switched into time control bit paths CT0-CT2 and CS/. These pipeline registers, 1 and 2, are rising edge off of the CLK/WE signal which is the system clock. The pipeline registers, 1 and 2, are switched in and out of the control paths depending upon the pipeline bit and the configuration register 8. There is no pipeline register in the data path. A special pipeline register called the parity register 17 is used in some of the parity modes. It affects only line D8/P.

This memory system supports a Halt Cycle, mainly for debugging and fault tolerant computing purposes. In the pipeline mode, a halt means that the pipeline register is not reloaded on the rising edge of CLK/WE. Instead, the previous contents are retained and the last cycle is repeated until something other than a halt cycle is detected. Note that since there is no pipeline register in the data path, whatever is on the data bus is written into the memory system during a halt if the last cycle was a write cycle. Reset cycles are treated as deselect cycles if a halt cycle occurs immediately after a reset. A halt cycle in the nonpipelined mode is treated as a deselect cycle, since the memory system has no record of what the last cycle was.

It is important to note that a halt cycle must be decoded prior to the pipeline register since it must prevent that register from being reloaded. FIG. 1 shows that the halt detection circuitry 19 is testing the CT lines before entering the CT decoder 6.

Note that CS/ is a (don't-care) in the halt cycle. Care must be exercised by a system designer using this memory system to prevent accidental halt cycles that may be caused by releasing the CT lines to an unknown state whenever the bus is not needed.

The parity checker/generator 13 and the parity register 17 are used to implement the parity function in this memory system. Parity is active if either of the parity bits in the configuration register 8 are 1. If the parity is active, the parity of the stored data word is present at the D8/P pin on a memory read cycle. If parity is active, D8/P functions as a parity output signal. It is inactive on a memory write cycle; ID8 is driven by the parity checker/generator 13 in that case, and represents parity generated over bits D0-D7. In a memory read cycle, a nine bit parity check is performed over bits ID0-ID8, and the result is sent out of the memory system over D8/P. The D8/P pin requires a special buffer 16. If parity is deactivated, it functions as a normal push-pull buffer, since these buffers are used on D0-D7. In the parity mode, it sometimes becomes desirable to tie the D8/P pins on many memory chips together to form a single parity error signal. When word length in excess of 8 bits is used, such as 16 bits, two or more memory system chips will be on at once to form the longer word. If one chip experiences a parity error, and another does not, there would be a conflict of signals. To resolve this, the D8/P buffer 16 may be programmed to deactive the pullup device. Certain configurations of the two parity control bits in the configuration register 8 will turn off the pullup device 16 on D8/P (see Table 2).

Parity checking can slow down system operation because checking cannot begin until data has been accessed and is stable. This extra delay may be eliminated if an extra stage of pipelining is used in the parity path. This extra stage complicates system timing somewhat in that parity for a read cycle does not become valid until the next cycle, if this extra register is used. However, there are no delays caused by a parity check. The use of this parity register 17 is programmable. It may be inserted in the path by setting a pipelined parity bit in the configuration register 8 (see Table 2).

The effect of this parity register 17 is to delay the parity from the read cycle until the next cycle. This mode of parity is referred to as next cycle parity, likewise same cycle parity occurrs when the parity register is bypassed.

If a parity error is detected, the active pulldown device 16 drops D8/P to an active low. Since there is an active pulldown device, the high to low transistion should occur at a high speed, comparable to a push-pull device. If the active pull up device is deactivated, pull up is done with an external resistor, which requires much more time than an active pull-up device. Because the data from the memory array has stablized, it is possible for the parity circuit to generate a false parity error, and pull the D8/P line low, thus requiring a long recovery time before parity is valid.

In the pipeline mode, with next cycle parity active, the parity register 17 shall prevent glitches from occurring on D8/P, thus obtaining the maximum possible speed from the memory system while using parity. This is not true in other modes of operation and the user must be aware of possible glitches to allow time for a passive pull up device to settle the parity line.

The configuration register 8 is a 3 bit control register used to determine which these special configurations are used. Table 2 shows the bit assignment in the configuration file. The configuration register 8 contains a pipeline bit and two parity control bits. The pipeline registers 1 and 2 are activated using the pipeline bit. Whenever this is high, the pipeline registers 1 and 2 are in the address and control bit paths, respectively. There are 2 parity control bits. If either one is high, then parity is active. As shown in Table 2 they also control an extra stage of pipelining in the parity output and the output buffer 16 for D8/P, the parity output. Data transfer to and from the configuration register 8 is done with I/O cycles.

TABLE 2-2

Configuration Register Function Table

| PIPE | PAR1 | PAR2 | FUNCTION |
|---|---|---|---|
| 0 | — | — | NonPipelined Operation |
| 1 | — | — | Pipelined Operation |
| — | 0 | 0 | No parity, Push-Pull output on D8/P |
| — | 0 | 1 | Same cycle parity, Push-Pull output on D8/P. |
| 0 | — | 1 | Same cycle parity, Push-pull device on D8/P |
| 0 | 1 | 0 | Same cycle parity, Pull down only on D8/P. |
| 1 | 1 | 0 | Next Cycle parity, Pull down only on D8/P. |
| 1 | 1 | 1 | Next cycle parity, Push-pull device on D8/P. |

Write protection is implemented using a write pulse gated circuit and two 8-bit registers 10 and 11. These registers, 10 and 11, the write circuit protect files, are addressed one bit at a time and provide protection against CPU and DMA initiated overwrites. The file to be used is determined by the decoding the CT lines. In the memory write with protection override cycle, the write protection files are ignored and the write pulse is always passed to the memory array 3.

The write protection circuit has a dedicated output, PV/, which is used for two functions. First, in a memory write cycle, this signal is used to indicate an unsuccessful write has been attempted into a protected area. In this case, the PV/ signal will go low and the write will not occur. The second use of this signal is in the I/O cycle. It will go low during any I/O cycle as an echo that a functional memory system is in the I/O mode. This is an aid in implementing the Mil-STD-1750A specification which requires an unimplemented memory vault be flagged when an empty area of memory or I/O space is addressed, although it does not do the entire function.

The PV/ signal will become valid shortly after the control lines are stable in the nonpipelined mode, or after the rising edge of CLK/WE in the pipelined mode. It is not necessary to wait for CLK/WE to go low, which ordinarily starts the write pulse.

The write protection bits are accessed directly by I/O cycles. They are also read in memory cycles according to the 1K block in memory defined by A0-A2 and by the cycle type, to determine if write pulse addresses. to the memory array are to be passed or blocked. The register file 10 or 11 to be used is determined by decoding CT0-CT2 to determine if a CPU or DMA cycle is occurring. A special write protection override cycle may be signaled by the CT bus. In this case the "dummy" file is addressed, which is not really a file at all, but some logic that always reads as 0 (not protected) to the write pulse gating circuit 12. A dummy file is used as a means of describing this operation since it occupies a vacant space in the I/O address space and may be used for other functions.

Table 3 shows how the configuration file bits are addressed the protection files 10 and 11. Certain locations in the I/O address space are reserved for future additions to the memory system and others are reserved for testing purposes. I/O cycles use only D0 to actually transfer data to and from the configuration register 8 and write protection registers 10 and 11. In an I/O write cycle, all data inputs are ignored, except for D0. In an I/O read cycle, only D0 will have valid data from the bit being read. Other data bits will not contain valid data in an I/O read cycle. They will be at valid logic levels for 1's and 0's, although the actual value is undefined. This is necessary when the memory system is used in a system where data from the memory system is latched on the system clock edge into a register. There is a small but finite chance that if the input to this register is at a level that is neither a valid 1 nor 0, than it will enter a metastable state and will remain there for several clock cycles. Such states are rarely encountered but are extremely difficult to find, and can cause considerable difficulty.

TABLE 3

| A4 | A3 | A2 | A1 | A0 | Function of bit (*1) |
|---|---|---|---|---|---|
| 0 | 0 | 0 | 0 | 0 | CPU PROTECT K0 |
| 0 | 0 | 0 | 0 | 1 | CPU PROTECT K1 |
| 0 | 0 | 0 | 1 | 0 | CPU PROTECT K2 |
| 0 | 0 | 0 | 1 | 1 | CPU PROTECT K3 |
| 0 | 0 | 1 | 0 | 0 | CPU PROTECT K4 |
| 0 | 0 | 1 | 0 | 1 | CPU PROTECT K5 |
| 0 | 0 | 1 | 1 | 0 | CPU PROTECT K6 |
| 0 | 0 | 1 | 1 | 1 | CPU PROTECT K7 |
| 0 | 1 | 0 | 0 | 0 | DMA PROTECT K0 |
| 0 | 1 | 0 | 0 | 1 | DMA PROTECT K1 |
| 0 | 1 | 0 | 1 | 0 | DMA PROTECT K2 |
| 0 | 1 | 0 | 1 | 1 | DMA PROTECT K3 |
| 0 | 1 | 1 | 0 | 0 | DMA PROTECT K4 |
| 0 | 1 | 1 | 0 | 1 | DMA PROTECT K5 |
| 0 | 1 | 1 | 1 | 0 | DMA PROTECT K6 |
| 0 | 1 | 1 | 1 | 1 | DMA PROTECT K7 |
| 1 | 0 | 0 | 0 | 0 | PIPELINE ENABLE |
| 1 | 0 | 0 | 0 | 1 | PARITY BIT 1 |
| 1 | 0 | 0 | 1 | 0 | PARITY BIT 2 |
| 1 | 0 | 0 | 1 | 1 | RESERVED (*2) |
| 1 | 0 | 1 | 0 | 0 | RESERVED (*2) |
| 1 | 0 | 1 | 0 | 1 | RESERVED (*2) |
| 1 | 0 | 1 | 1 | 0 | RESERVED (*2) |
| 1 | 0 | 1 | 1 | 1 | RESERVED (*2) |
| 1 | 1 | 0 | 0 | 0 | RESERVED FOR TESTING (*3) |
| 1 | 1 | 0 | 0 | 1 | RESERVED FOR TESTING (*3) |
| 1 | 1 | 0 | 1 | 0 | RESERVED FOR TESTING (*3) |
| 1 | 1 | 0 | 1 | 1 | RESERVED FOR TESTING (*3) |
| 1 | 1 | 1 | 0 | 0 | RESERVED (*2) |
| 1 | 1 | 1 | 0 | 1 | RESERVED (*2) |
| 1 | 1 | 1 | 1 | 0 | RESERVED (*2) |
| 1 | 1 | 1 | 1 | 1 | RESERVED (*2) |

Figure 2:
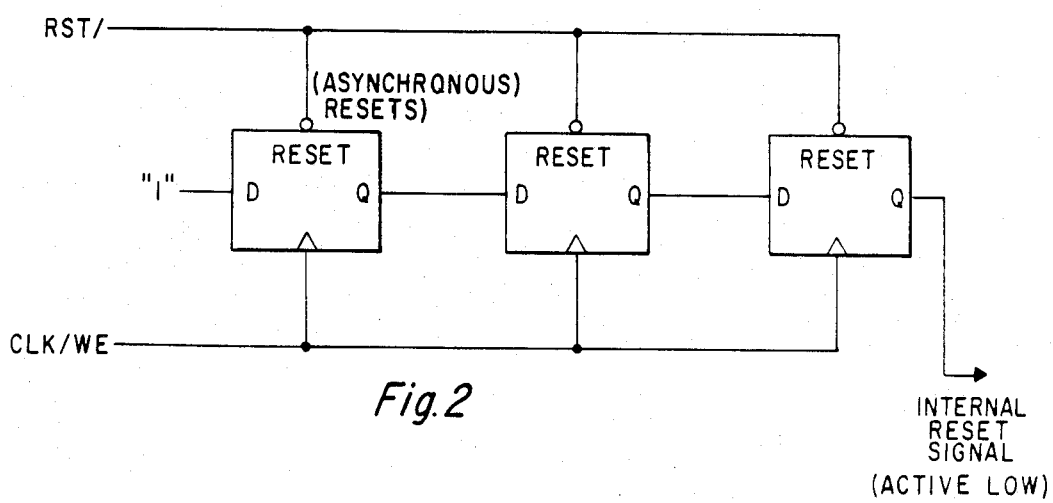
FIG. 2 is a schematic diagram of the reset circuitry.

(*1) - Active high function
(*2) - This Operation not defined at this time
(*3) - For in-house use only As shown in Table 1, the reset function overrides all other control signals. It is the only signal that operates asynchronously in either pipelined or nonpipelined mode. Reset immediately causes all buffers to enter a high impedance state. FIG. 2 shows the logic used in the reset function. Entering the reset state is an asynchronous process that starts as soon as a logic 0 is detected on the reset pin, however leaving the reset state is a synchronous process; three rising edges of the CLK/WE pins are required to leave this state. In a nonpipelined system, this requires three write pulses. Referring to FIG. 2, the implementation of the synchronous reset is through 3 D type flip-flops as shown.

Table 4 shows the reset states of all the configuration bits in the configuration register 8. The main purpose of requiring 3 rising edges of CLK/WE to leave the reset state is to allow synchronization of the memory system with other components in the system without having to use an asynchronous reset signal. Logic internal to the memory system will synchronize it to CLK/WE before leaving the reset state. A 3 edge delay allows the processor or other system controller active before the memory devices do. This also allows the memory system internal registers to be synchronously set to a known state.

TABLE 4

Reset States of Control Bits

| BIT | RESET STATE | FUNCTION |
| --- | --- | --- |
| CPUWP0-7 | 0 (not protect.) | CPU protection bits |
| DMAWP0-7 | 0 (not protect.) | DMA protection bits |
| PIPE | 0 (NonPipelined) | Pipeline control |
| PAR0 | 0 (No Parity) | Parity Control 0 |
| PAR1 | 0 (No Parity) | Parity Control 1 |

The memory system may be also operated in several "dumb" modes. A dumb mode may be defined as an operation in a system that cannot generate all of the possible cycle type instructions. There are two levels of "dumbness" that are supported by the present invention. In the first level, the processor can perform I/O cycles to modify the configuration and write protection bits. This is achieved by hardwiring CT0 high. In this first dumb mode, the memory system never executes a HALT cycle and write protection is always ignored. CT1 is used to qualify between I/O (0) and memory (1) cycles.

In a second dumb mode, CT1 is also tied high. This mode allows only memory reads and memory writes with protection override. This state requires that the system processor source only a write/read line which is connected to CT2. The memory system is selected for use by the CS/input. This is necessary for all reads and writes to both array 3 and the control bits.

It is important that since the memory system may be operated in pipeline mode, the chip selection process actually occurs on the rising edge of each clock, when pipelined. Once sampled, it may change states and the rest of the cycle will proceed. The same is also true if pipeline parity is used. In that case CS/ is sampled two cycles before. According to Table I, the CS/ signal is a "DON'T CARE" whenever a HALT cycle is initiated in the pipeline mode. This means that any cycle could be repeated, even if the chip was not selected on the current cycle. This should be taken into careful consideration by the system designer, not only when deliberately using a HALT cycle, but also to prevent accidential HALT cycles caused by invalid signals on the CT lines. However, in the nonpipeline mode, there is no HALT cycle. The code for a HALT will cause a deselect.

The RST/ pin is used to trigger a reset. The reset causes an immediate (asynchronous) disabling of all output buffers. It also sets an internal counter that will not allow exiting from the reset state until after the reset line is high and 3 rising edges are detected on CLK/WE line (see FIG. 2). All internal control registers are set to known states. This need not be done asynchronously since the output buffers are immediately disabled, and at least 3 clocks are available before leaving the reset state. This is an active low input. The RST/ line overrides all other inputs, even CS/, no matter what the state of the memory system is.

Memory and control registers are addressed by the address lines A0-A12. A0 is considered the most significant bit of the address. The only "significance" of this is that the 1K write protection boundaries are chosen by A0, A1 and A2. Addressing of the control bits during I/O cycles uses A0-A4. Selection of either memory or I/O cycles is not determined by the address lines, rather it is controlled by the CT lines.

Lines D0-D7 are bidirectional data lines over which data is transferred to and from the memory system. D0 is also used to transfer data to and from the control registers 8, 10 and 11 during I/O cycles. The direction of data transfer is controlled by decoding the CT lines.

Line D8/P is a multifunctional line which may operate as a simple data line, or as a parity error output line as was previously discussed. A special buffer 16 with a deactivated pull up device (programmed) allows parity error outputs from several active memory systems that are tied together and wide words to eliminate extra system logic.

The PV/ line is used to signal that either an I/O cycle is taking place or a write failure has occurred due to a protection violation by either the CPU or DMA devices as indicated by the cycle type.

CLK/WE is a multifunctional line. In the pipeline mode it is the system clock, and controls the loading of instructions and data into the pipeline registers, as well as controlling the write pulses to memory and control bits. In the nonpipelined mode, it functions as the write pulse only. It should be noted that the design of the memory system allows this line to be tied to the system clock even in the nonpipelined mode, and uses the CT lines to determine the actual operation. No write to either memory or control bits can occur unless the CT lines call for a write. All output buffers, such as 21, are "push-pull" types with both active pull up and pull down devices, with the exception of buffer 16 for D8/P which may have the pull up device deactivated. In this case an external pull up resistor is required. All inputs and outputs to the memory system are designed to TTL capable with respect to the valid 0 and 1 voltage ranges.

Timing

The memory system may operate in either pipelined or nonpipelined mode. The difference between the timing of these modes is substantially different. Read and write cycles may be performed in either mode to either memory or control registers (I/O) locations. There are four classes of cycles, although there are more cycle types. These cycles are:
1. Memory Read Cycle
2. Memory Write Cycle
3. I/O Read Cycle
4. I/O Write Cycle.

A read cycle is any cycle where data is sourced by the memory system. A write cycle is any cycle where the data is sourced externally and deposited in the memory system. A memory cycle is any cycle where memory array 3 is accessed. An I/O cycle is any cycle where the control or write protect bits are accessed. For example, a cycle where data is deposited into a write protect bit is an I/O cycle; it is also a write cycle, therefore an I/O write cycle is performed.

Figure 3:
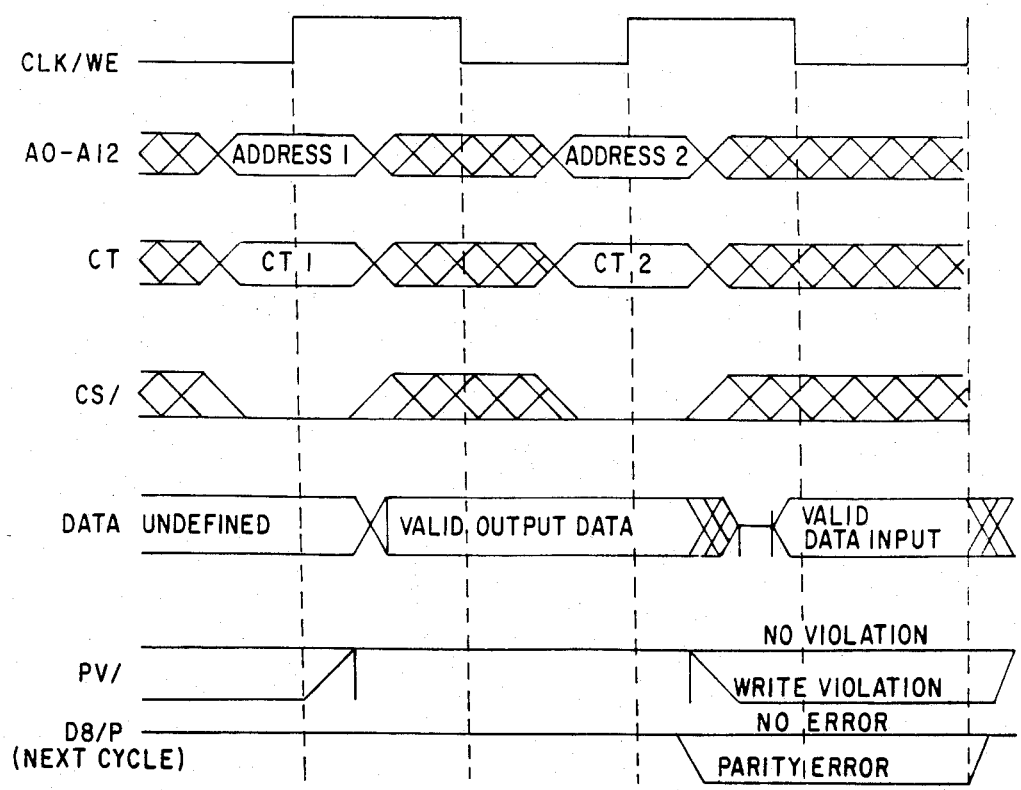
FIG. 3 is a timing diagram for the pipeline memory cycle.

FIG. 3 shows a timing diagram which illustrates both the memory read and write cycles in the pipeline mode. In this example, a memory read cycle is followed by a memory write cycle. The PV/ output indicates whether or not the write was successful. If the PV/ line goes low, then the output was unsuccessful (unsuccessful because the write protect bit for the selected memory area was set to (1). The pipeline mode makes full use of the memory system registers that latch the address and control lines in order to relieve the address and control setup time penalty. The data lines are not latched and data must appear at the right time as shown by the diagram in FIG. 3. Parity may be latched internally, depending upon the parity control bits in the configuration register 8 (FIG. 1). This is why the timing diagram (FIG. 3) shows a parity output cycle delayed from this data. This may be somewhat inconvenient, but it is considered less important than slowing the entire cycle down by enough time for data to propagate through the parity checker 13 (FIG. 1). In any case, it may be programmed off, so that a slower cycle with parity in the same cycle may be performed, as previously discussed.

Figure 4:
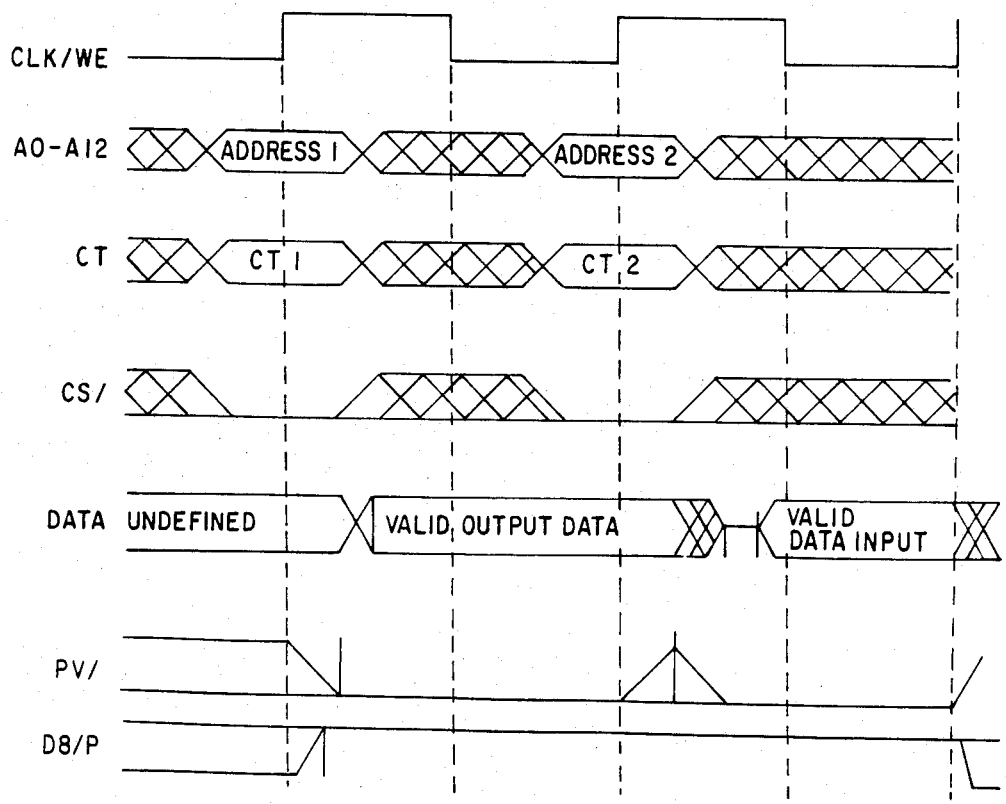
FIG. 4 is a timing diagram for the pipelined I/O cycle.

FIG. 4 shows a timing diagram for accessing the control and write protect bits. There are several differences between this type of cycle and the memory cycle. First of all, data is transferred over D0 only, although valid voltage levels are maintained on other data outputs to prevent the possibility of a mestable state in processors using this memory system. Another difference is that the PV/ output is always low. This is used as a confirmation signal that an I/O cycle is taking place. The final difference is that the parity line is always inactive (high or high impedance, depending upon programming) for the parity output that corresponds to the I/O cycle.

Figure 5:
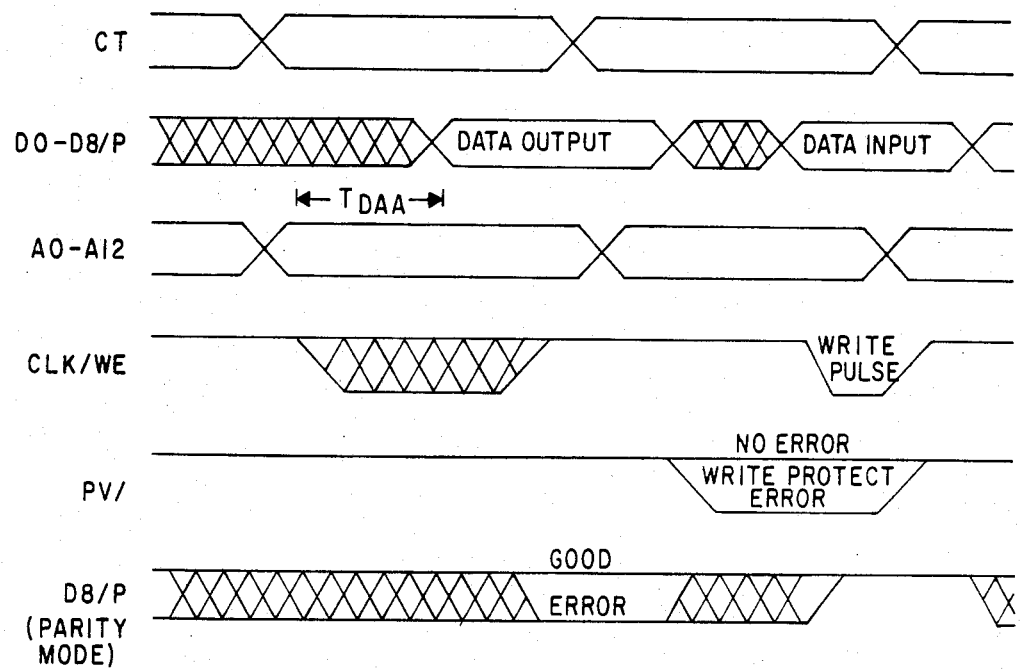
FIG. 5 is a timing diagram for the nonpipeline memory cycle.

FIG. 5 shows the timing diagram for a nonpipelined memory read and write cycle. This is substantially different from the same cycles in the pipeline mode. A nonpipeline cycle is usually substantially slower than the corresponding cycle. In the nonpipeline mode, the system clock may still be used as a write enable signal. This requires that no operation be performed if CLK/WE is low and CT lines indicate a read cycle. It is also possible to use CS/ to control the write cycle, since writes cannot occur when the chip is not selected.

Figure 6:
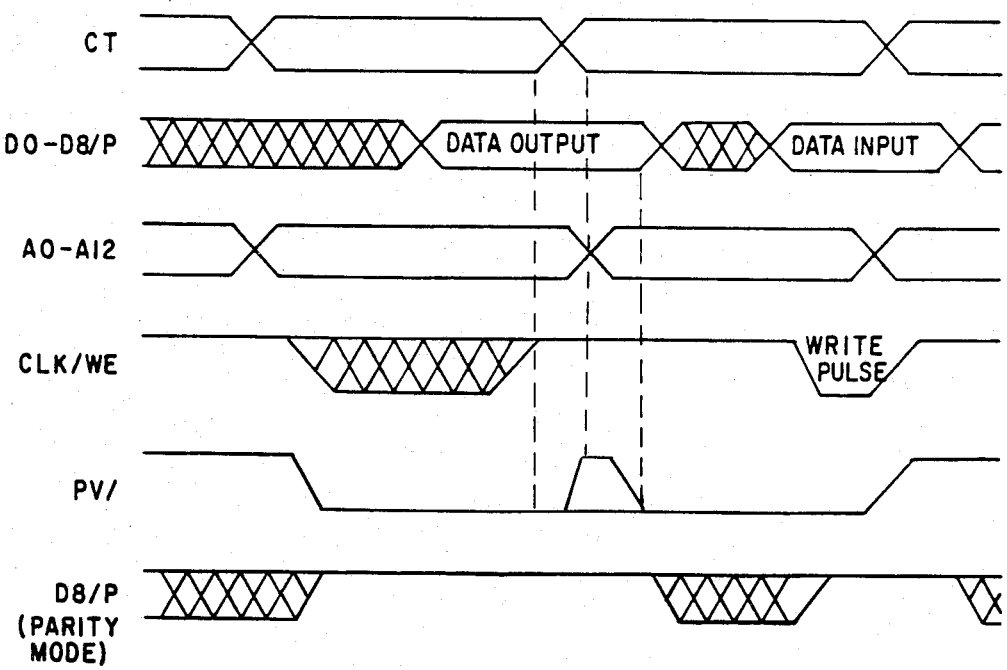
FIG. 6 is a timing diagram for the nonpipelined I/O cycle.

FIG. 6 illustrates the nonpipeline I/O cycle. The nonpipelined I/O cycles are similar in form to the nonpipelined memory cycles, and similar in function to the pipelined I/O cycles. PV/ always goes low, and parity always stays high during the I/O cycle. PV/ goes low as an echo of the I/O cycle, and parity stays high since parity is not used in the I/O cycle.

The peripheral functions are controlled in this memory system through the use of the chip select (CS/) line together with the CLK/WE line and the CT0 through CT2 lines. The CT decoder 6 in FIG. 1 decodes the control lines in order to control the peripheral functions in this memory system.

Figure 7A:
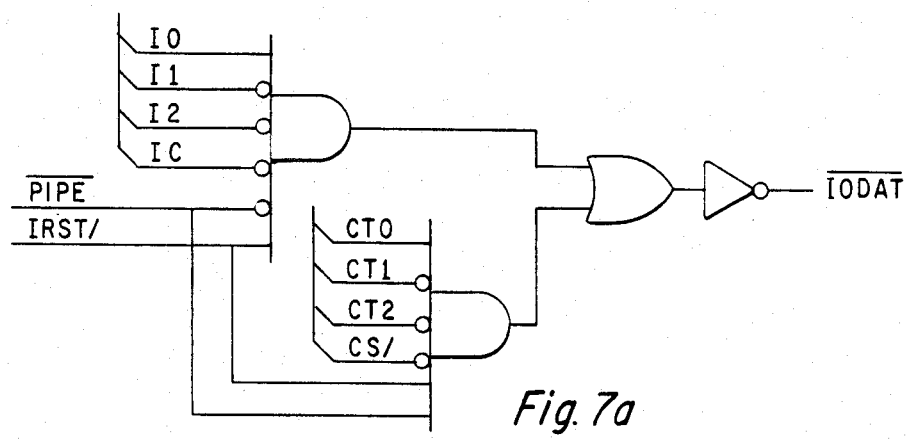
FIG. 7a is a schematic of a portion of the control decode circuitry.

FIG. 7a illustrates on the logic functions performed by the CT decoder 6. The lines I0 through I2 and Ic are internally buffered lines representing CT0 through CT2 and CS/. Pipe/ is the internal designation of the pipeline mode. IRST/ is the internal designation of the reset signal which is the output of the circuitry illustrated in FIG. 2. CT0 through CT2 and CS/ are the received respective signals. The logic in FIG. 7a produces the I/O DAT/ signal which determines an internal I/O cycle.

Figure 7B:
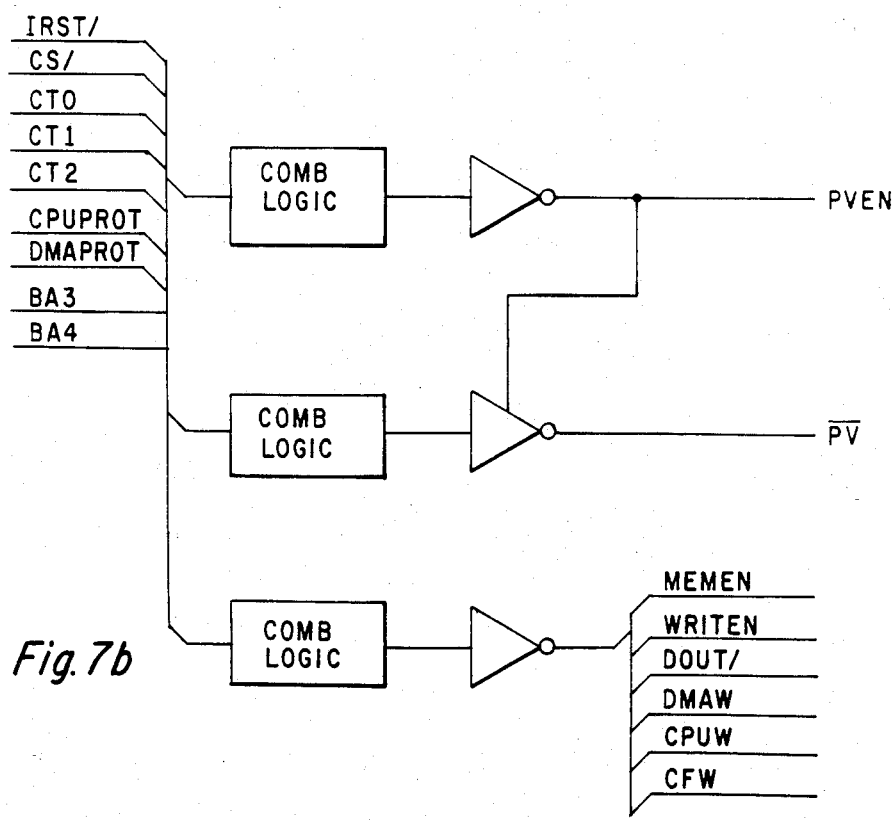
FIG. 7b is a schematic of the remaining control decode circuitry.

FIG. 7b is a top level diagram of the remainder of the logic in the CT decoder 6 in FIG. 1. This logic includes inputs CPUPROT and DMAPROT which are the CPU protection signal and DMA protection signal designating that the data that is being addressed is protected in reference to the DT write protect file or the CPU write protect file. BA3 and BA4 are the respective address bits for the memory access. The logic in FIG. 7b outputs a PVEN and a PV/ signal. PV/ designates a prevent violation. PVEN is an enable signal to enable the tristate buffer to produce the PV/ signal as shown. The remaining outputs of the circuitry are MEMEN for memory enable, WRITEN for write enable, DOUT/ to designate that memory data is being placed on the external bus, DMAW for DMA write, CPUW for CPU write and CPW for a write into the configuration register.

Figure 7C:
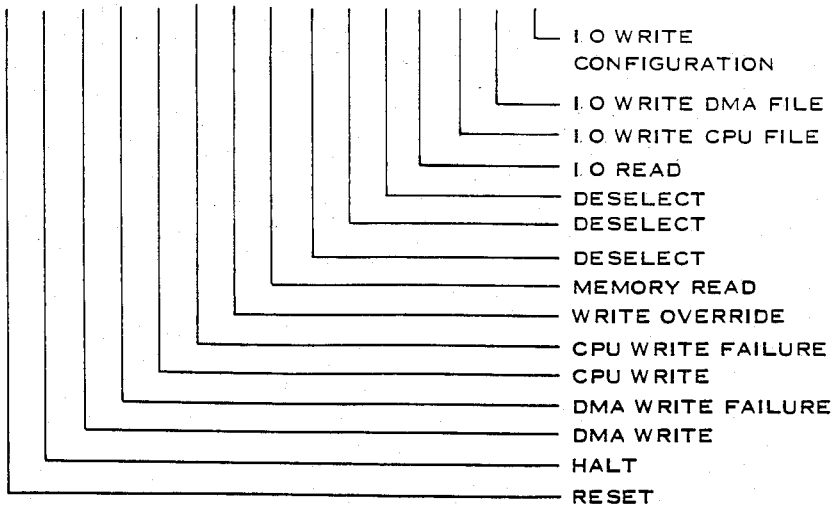
FIG. 7c is a truth table for the combinational logic illustrated in FIG. 7b.

FIG. 7c illustrates the truth table for the combinational logic shown in FIG. 7b. Note that each line of the output is mapped to a specific event. The lines mapped "D SELECT" designate a "DON'T CARE" situation for this particular portion of the memory system since CS/ is 1, meaning that the chip has not been selected. The CPU write failure and DMA write failure results designate the failure to input data into the memory because of intervention of the DMA and CPU write protection circuitry.

Memory Cell

The memory cell is the SRAM ARRAY 3 in FIG. 1 is disclosed in the patent application entitled, "Low Power SRAM Cell" by Pallab K. Chatterjee and Ahwin M. Shah, Ser. No. 357,944, filed Mar. 15, 1982, herein incorporated by reference.

What is claimed is:

1. A memory apparatus comprising:
   an array of storage elements connected to a plurality of addressing lines for selectively connecting a group of the storage elements to a plurality of data lines;
   control means connected to the array for regulating the reading and writing of data via the data bus to the storage elements selectively connected by the addressing lines to the plurality of data lines; and
   pipeline circuit means connected to the address lines and to the array of storage elements for storing, in response to the control means, a first address contained on the address lines and for storing, in response to the control means, a first group of control data contained on control lines connected to the control means.

2. A memory apparatus comprising:
   an array of storage elements connected to a plurality of addressing lines for selectively connecting a group of the storage elements to a plurality of data lines;
   control means connected to the array for regulating the reading and writing of data via the data bus to the storage elements selectively connected by the addressing lines to the plurality of data lines; and
   pipeline circuit means connected to the address lines and to the array of storage elements for storing, in response to the control means, a first address contained on the address lines and for storing, in response to the control means, a first group of control data contained on control lines connected to the control means, and
   wherein said control means is programmable from said control lines to selectively connect the pipeline circuit means for storage of the first address.

3. A memory apparatus comprising:
   an array of storage elements connected to a plurality of addresing lines for selectively connecting a group of the storage elements to a plurality of data lines;

control means connected to the array for regulating the reading and writing of data via the data bus to the storage elements selectively connected by the addressing lines to the plurality of data lines; and pipeline circuit means connected to the address lines and to the array of storage elements for storing, in response to the control means, a first address contained on the address lines and for storing, in response to the control means, a first group of control data contained on control lines connected to the control means, wherein said control means is programmable from said control lines to selectively connect the pipeline circuit means for storage of the first address, and wherein said control means desiginates the pipeline circuit means to store the first address, allowing a second address to be placed on the address lines during the cycle that memory apparatus is placing the contents of the address lines selectively group of storage elements through the plurality of data lines.

4. A memory apparatus according to claim 3, wherein said pipeline circuit means further includes means to store a signal corresponding to the parity of the data stored in the array of storage elements selected by the address lines.

5. A memory apparatus according to claim 4, wherein said pipeline circuit means stores said in response to the control means in a manner that prevents the parity from being transmitted for the data selected by the first address until the second address is stored.

* * * * *

REEXAMINATION CERTIFICATE (3534th)

United States Patent [19]
Cline et al.

[11] B1 4,597,061
[45] Certificate Issued Jun. 9, 1998

[54] MEMORY SYSTEM USING PIPELINE CIRCUITRY FOR IMPROVED SYSTEM

[75] Inventors: James H. Cline, Allen; David M. Chastain, Plano, both of Tex.

[73] Assignee: Texas Instruments Incorporated, Dallas, Tex.

Reexamination Request:
No. 90/004,717, Aug. 8, 1997

Reexamination Certificate for:
Patent No.: 4,597,061
Issued: Jun. 24, 1986
Appl. No.: 454,938
Filed: Jan. 3, 1983

[51] Int. Cl.$^6$ .................................. G11C 13/00
[52] U.S. Cl. ............... 365/189.01; 365/220; 365/230.01
[58] Field of Search .................. 365/189.01, 189.03, 365/189.04, 230.05, 230.01, 220, 221

[56] References Cited

U.S. PATENT DOCUMENTS 4,253,147  2/1981  MacDougall et al. .............. 364/200
4,330,852  5/1982  Redwine et al. .................... 365/221

FOREIGN PATENT DOCUMENTS 55-38603  3/1980  Japan ............................. G11C 7/00

*Primary Examiner*—Terrell W. Fears

[57] ABSTRACT

A memory apparatus including an array of storage elements connected to a plurality of addressing lines for selectively connecting a group of storage elements to a plurality of data lines. Control circuitry is also provided that is connected to the array for regulating the reading and writing of data to and from the data lines to the storage elements addressed by the address lines. A pipeline circuit is also provided that is connected to the address lines and to array of storage elements to store in response to the control circuit an address contained on the address lines. This memory system architecture allows for the address to be stored to allow the second address to be placed on the address lines while the first addressed data is being accessed from the memory array. This memory system also provides for the parity to be generated for the data in the array during the access of the data for the first address or after the pipeline circuit has been loaded with the second address.

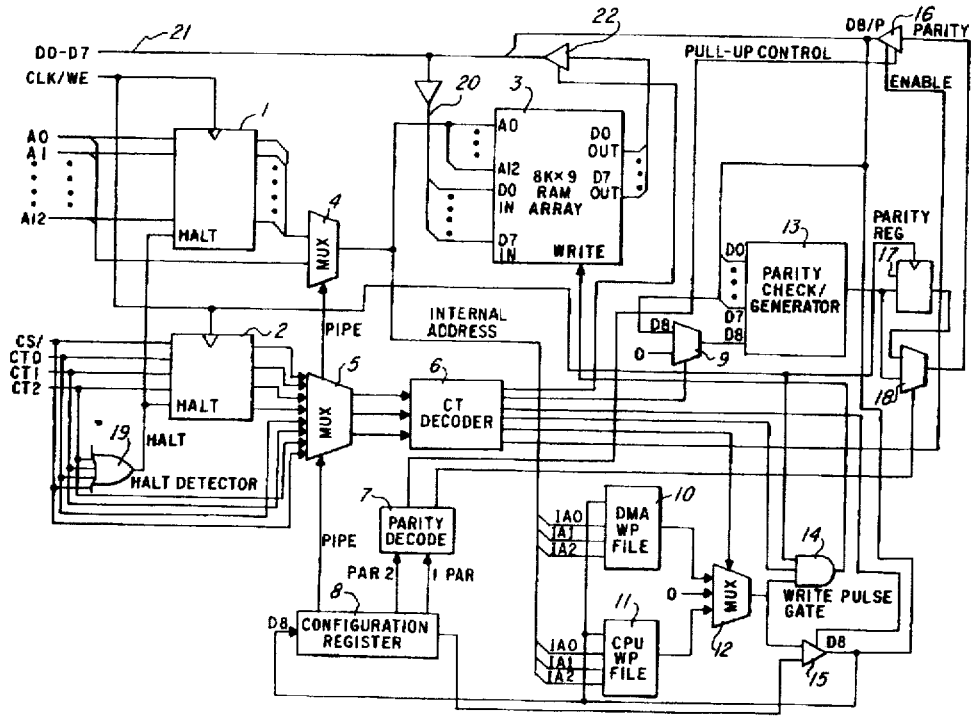

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, line 56 to column 5, line 6:

The invention may be thought of as a memory with a semi-intelligent memory controller that is capable of executing a number of instructions. A different type of memory cycle is performed depending upon the instruction. An instruction is received on the CT (Cycle Type) lines (CS, CT0 through CT2) at the beginning of every cycle. These three lines CT0, [CT19] *CT1*, and CT2 and with CS/ and RST/ are decoded to determine the operation to be performed. The CT decoder 2 is responsible for deriving the internal control signals from the CT lines. Table 1 shows the different types of cycles supported, and their codes. Conventional memories have all control signals in unencoded form available at their input pins. In order to retain all of the special features, and remain in a 32 contact package configuration, it is necessary to encode some of the control signals into a denser form. Since memory chips are traditionally used in relatively large numbers, it is advantageous to reduce the number of pins in the package.

AS A RESULT OF REEXAMINATION, IT HAS BEEN DETERMINED THAT:

Claims 1–3 and 5 are determined to be patentable as amended.

Claim 4, dependent on an amended claim, is determined to be patentable.

New claims 6–20 are added and determined to be patentable.

1. A memory apparatus comprising:
   an array of storage elements connected to a plurality of [addressing] *address* lines for selectively connecting a group of the storage elements to a plurality of data lines, *the data lines including a memory data bus and an internal data bus*;
   *a data input circuit connected between the memory data bus and the internal data bus for receiving data from the memory data bus;*
   control means *coupled to receive a clock signal, the control means* connected to the array for regulating the reading and writing of data via the *memory* data bus to the storage elements selectively connected by the [addressing] *address* lines to the plurality of data lines; and
   pipeline circuit means connected to the address lines and to the array of storage elements for storing, in response to the control means, a first address contained on the address lines and for storing, in response to the control means, a first group of control data contained on control lines connected to the control means, *wherein the address lines receive the first address and the data input circuit receives the data input signal during a first cycle of the clock signal.*

2. A memory apparatus comprising:
   an array of storage elements connected to a plurality of [addressing] *address* lines for selectively connecting a group of the storage elements to a plurality of data lines, *the data lines including a memory data bus and an internal data bus*;
   *a data input circuit connected between the memory data bus and the internal data bus for receiving data from the memory data bus;*
   control means *coupled to receive a clock signal, the control means* connected to the array for regulating the reading and writing of data via the *memory* data bus to the storage elements selectively connected by the [addressing] *address* lines to the plurality of data lines; and
   pipeline circuit means connected to the address lines and to the array of storage elements for storing, in response to the control means, a first address contained on the address lines and for storing, in response to the control means, a first group of control data contained on control lines connected to the control means, *wherein the address lines receive the first address and the data input circuit receives the data input signal during a first cycle of the clock signal,* and
   wherein said control means is programmable from said control lines to selectively connect the pipeline circuit means for storage of the first address.

3. A memory apparatus comprising:
   an array of storage elements connected to a plurality of [addressing] *address* lines for selectively connecting a group of the storage elements to a plurality of data lines, *the data lines including a memory data bus and an internal data bus*;
   *a data input circuit connected between the memory data bus and the internal data bus for receiving data from the memory data bus;*
   control means *coupled to receive a clock signal, the control means* connected to the array for regulating the reading and writing of data via the *memory* data bus to the storage elements selectively connected by the [addressing] *address* lines to the plurality of data lines; and
   pipeline circuit means connected to the address lines and to the array of storage elements for storing, in response to the control means, a first address contained on the address lines and for storing, in response to the control means, a first group of control data contained on control lines connected to the control means, *wherein the address lines receive the first address and the data input circuit receives the data input signal during a first cycle of the clock signal,*
   wherein said control means is programmable from said control lines to selectively connect the pipeline circuit means for storage of the first address, and
   wherein said control means desiginates the pipeline circuit means to store the first address, allowing a second address to be placed on the address lines during the cycle that memory apparatus is [placing the contents of the address lines selectively group of storage elements through] *applying the contents of the pipeline circuit means for selectively connecting the group of storage elements to* the plurality of data lines.

5. A memory apparatus according to claim 4, wherein said pipeline circuit means stores said *signal* in response to the control means in a manner that prevents the parity from being transmitted for the data selected by the first address until the second address is stored.

6. A memory apparatus as in claim 1, wherein said pipeline circuit means stores the first address and the first group of control data in response to the first cycle of the clock signal.

7. A memory apparatus as in claim 1, wherein the array of storage elements is arranged for storing a plurality of data words, each data word comprising a plurality of data bits and a parity bit.

8. A memory apparatus as in claim 7, wherein the control means further comprises a configuration register, the configuration register producing a control signal, the control signal selecting a second cycle of the clock signal from a plurality of cycles following the first cycle for applying at least one bit of the data word to the memory data bus.

9. A memory apparatus as in claim 1, wherein the control means further comprises a configuration register for controlling operation of the pipeline circuit means, the configuration register including control registers arranged for receiving control data during an I/O cycle.

10. A memory apparatus as in claim 9, wherein the configuration register produces a control signal for selecting one of a plurality of cycles of the clock signal for selectively connecting the group of the storage elements to the plurality of data lines.

11. A memory apparatus as in claim 9, wherein the configuration register produces a control signal for selecting one of a plurality of cycles of the clock signal for said regulating the reading and writing of data.

12. A semiconductor device including a memory apparatus, the memory apparatus comprising:

an array of storage elements connected to a plurality of address lines for selectively connecting a group of the storage elements to a plurality of data lines, the address lines comprising an address bus, the data lines comprising a data bus, wherein the address lines are different from the data lines;

a control circuit coupled to receive a clock signal, the control circuit connected to the array for regulating the reading and writing of data via the same data lines to the storage elements, the storage elements selectively connected by an address contained on address lines to the plurality of data lines; and a pipeline circuit connected to the address lines and to the array of storage elements for storing, in response to the control circuit, the address contained on the address lines and for storing, in response to the control circuit, a group of control data contained on control lines connected to the control circuit.

13. A semiconductor device as in claim 12, wherein said regulating includes the reading and writing of data synchronously with the clock signal.

14. A semiconductor device as in claim 13, wherein the data is applied to the data lines and the address is applied to the address lines during a first cycle of the clock signal.

15. A semiconductor device as in claim 14, wherein the pipeline circuit stores the address and the group of control data in reponse to the first cycle of the clock signal.

16. A semiconductor device as in claim 15, wherein the array of storage elements is arranged for storing a plurality of data words, each data word comprising a plurality of data bits and parity bit.

17. A semiconductor device as in claim 16, wherein the control circuit further comprises a configuration register, the configuration register producing a control signal for selecting a second cycle of the clock signal from a plurality of cycles following the first cycle for applying at least one bit of a data word to the data bus.

18. A semiconductor device as in claim 15, wherein the control means further comprises a configuration register for controlling operation of the pipeline circuit means, the configuration register including control registers arranged for receiving control data during an I/O cycle.

19. A semiconductor device as in claim 18, wherein the configuration register produces a control signal for selecting one of a plurality of cycles of the clock signal for selectively connecting the group of the storage elements to the plurality of data lines.

20. A semiconductor device as in claim 18, wherein the configuration register produces a control signal for selecting one of a plurality of cycles of the clock signal for said regulating the reading and writing of data.

* * * * *